United States Patent [19]

Fujita et al.

[11] 4,338,574
[45] Jul. 6, 1982

[54] CARRIER RECOVERING CIRCUIT FOR PHASE MODULATED SIGNAL

[75] Inventors: Toshio Fujita; Youichi Matsumoto; Yoshimi Tagashira, all of Tokyo, Japan

[73] Assignee: Nippon Electric Co., Ltd., Tokyo, Japan

[21] Appl. No.: 134,001

[22] Filed: Mar. 26, 1980

[30] Foreign Application Priority Data

Mar. 30, 1979 [JP] Japan .................. 54/39132

[51] Int. Cl.³ ............................. H03L 7/08
[52] U.S. Cl. .................... 331/1 A; 329/50; 329/122; 331/8; 331/12; 331/36 C; 331/117 R
[58] Field of Search .............. 331/1 A, 10–12, 331/23, 25; 329/50, 122, 124; 375/120; 455/260

[56] References Cited

U.S. PATENT DOCUMENTS

| | | | |
|---|---|---|---|
| 4,100,503 | 7/1978 | Lindsey et al. | 331/12 X |
| 4,156,204 | 5/1979 | Hargis | 331/12 |
| 4,255,713 | 3/1981 | Yoshida | 329/124 X |

FOREIGN PATENT DOCUMENTS 2411405 9/1975 Fed. Rep. of Germany ........ 331/12

*Primary Examiner*—Siegfried H. Grimm
*Attorney, Agent, or Firm*—Sughrue, Mion, Zinn, Macpeak, and Seas

[57] ABSTRACT

The voltage controlled oscillator (VCO) in a phase-locked loop carrier recovery circuit is provided with two control signals, one based upon a phase error between the phase modulated carrier and VCO output and the other based upon a frequency error between the phase modulated carrier and VCO output.

4 Claims, 16 Drawing Figures

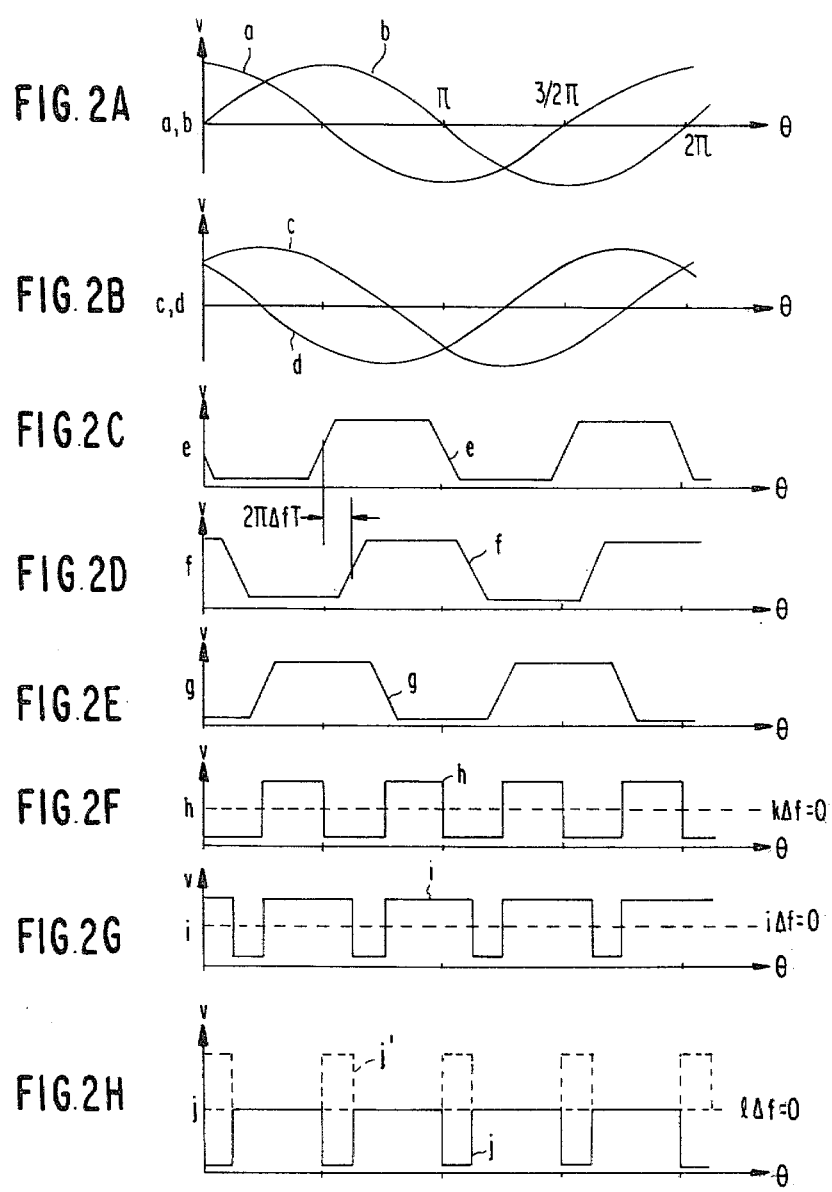

CARRIER RECOVERING CIRCUIT FOR PHASE MODULATED SIGNAL

BACKGROUND OF THE INVENTION

The present invention relates to a carrier recovering circuit for use in a demodulator for a phase-modulated carrier wave and, more particularly to such a carrier recovering circuit having a phase locked loop (PLL) of expanded capture range in which the phase synchronization can be restored.

One of the conventional approaches to the expansion of the capture range of a PLL employs a low-frequency frequency-sweep oscillator having an oscillation frequency dependent on the internal impedance of the loop. Since the impedance of the loop is low under the synchronized state while it is high under the non-synchronized state, the sweep oscillator stops its oscillation under the synchronized state. This is due to the fact that the oscillator constitutes a negative feedback circuit under the synchronized state. In contrast, under the non-synchronized state, the oscillator restores oscillation, which provides a sweep voltage applied to the voltage controlled oscillator constituting the loop. A typical example of a system based on this approach is described in U.S. Pat. No. 2,972,720.

The system of the referenced patent has the advantage of simplicity. However, it involves the problem of the so-called false lock when used for the demodulation of a multi-phase (N-phase, N being equal to or greater than 2) phase-modulated carrier wave. More definitely, the phase locking of the output of the PLL tends to be achieved not only at the desired center frequency $f_c$ (clock frequency) but also at a frequency shifted by $f_c/n$ from the clock frequency $f_c$ (n being an integer), so far as such shifted frequency lies in the capture range. Since the loop impedance is lowered even under such an undesirable false lock state, the oscillation of the frequency-sweep oscillator is stopped, maintaining the phase locked stated at the shifted frequency, thus preventing the accurate demodulation of the incoming phase-modulated carrier wave.

One approach to the prevention of such a false lock may consist of a control, responsive to the noise level within the loop, over the stopping of oscillation at the frequency-sweep oscillator. This approach is based on the fact that a false lock is always accompanied by an increase in the noise level within the loop.

However, it has a weakness attributed to its dependence on the noise level, which is supposed to be distinguishable between the desired locked state and the false locked state. More definitely, under such a situation where there is no appreciable difference in noise level because of frequency band restriction or a delay characteristic of the transmission channel for the signal, a high noise level does not necessarily indicate the false locked state. Thus, the PPL tends to be driven to malfunction when such an approach is relied on.

SUMMARY OF THE INVENTION

It is therefore an object of the present invention to provide a PLL for the demodulation of a multi-phase modulated carrier wave, which is capable of withstanding the tendency to false lock state while maintaining a broad capture range.

According to the present invention, there is provided a phase locked loop circuit comprising: a voltage-controlled oscillator for generating a reference phase signal in response to a control signal, means for phase-detecting an N-phase ($N=2^n$, n is a positive integer) phase-modulated carrier wave on the basis of the reference phase signal, means connected to the output of the phase-detecting means for detecting phase and frequency errors between the modulated carrier wave and the reference phase signal, and means for supplying the outputs of the phase and frequency error detecting means to the voltage-controlled oscillator as the control signal.

DESCRIPTION OF THE DRAWINGS

The features and advantages of the present invention will now be described in detail with reference to the accompanying drawings, in which:

FIGS. 2A–2H are waveform diagrams to explain the operation of the circuit shown in FIG. 1;

DESCRIPTION OF THE PREFERRED EMBODIMENT

Figure 1:
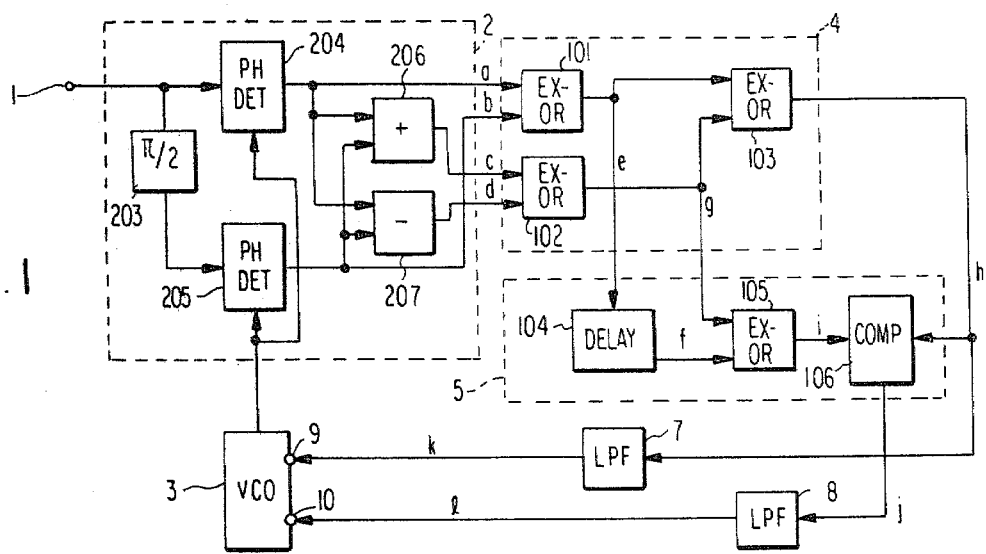
FIG. 1 is a block diagram of a synchronous demodulation circuit for a 4-phase phase-modulated carrier wave according to the present invention.
Figure 8:
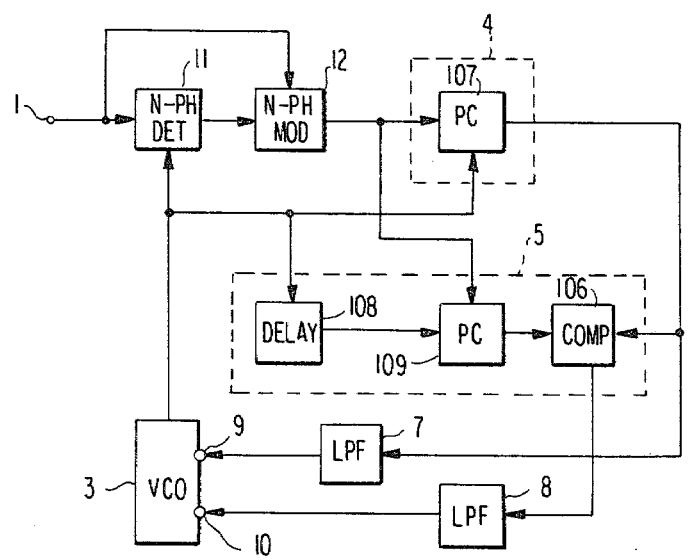
FIG. 8 is a block diagram of an N-phase reverse modulation circuit according to the present invention.

Referring now to FIG. 1, and 8-phase phase detector circuit 2, to which the oscillation output of a voltage-controlled oscillator (VCO) 3 is supplied as a reference phase carrier, phase-detects a 4-phase phase-modulated carrier wave supplied to an input terminal 1. The in-phase component of the incoming carrier wave with respect to the reference phase carrier is detected by a phase detector 204 in the circuit 2 to provide an output signal a. On the other hand, the quadrature phase component is applied to another phase detector 205, through a $\pi/2$ phase-shifter 203, which provides an output signal b. Signals a and b are respectively applied to adder 206 and a subtractor 207, which respectively provide summation and subtraction outputs c and d. The output c constitutes a $\pi/4$ phase difference signal while d constitutes a $-\pi/4$ phase difference signal.

The mutually orthogonal output pairs a-b and c-d of the phase detector 2 are supplied to and multiplied by exclusive OR circuits 101 and 102 which constitute the first stage of a 2-stage phase error detection circuit 4. Outputs e and g of the OR circuits 101 and 102 are supplied to another exclusive OR circuit 103, to form a phase error signal h. (For details of the phase error signal detection, reference is made to U.S. Pat. No. 3,600,700). At the same time, the signal e is supplied through a delay means 104 to still another exclusive OR circuit 105, to which the signal g is also applied. The output i of the exclusive OR circuit 105 is applied to a voltage comparator 106, such as a differential amplifier, to which the phase error signal h is also applied as the other input. The delay means 104, the exclusive OR circuit 105 and the voltage comparator 106 constitute a frequency error detection circuit 5.

The phase error signal h is supplied also to a first control input terminal 9 of the VCO 3 through a low pass filter 7 as a frequency control input k. The voltage comparator 106 provides an output voltage j representative of the voltage difference between the phase error signal h and the output i from the exclusive OR circuit 105. The output j is then applied through another low pass filter 8 to a second control input terminal 10 of the VCO 3 as a second oscillation frequency control input l.

Referring to FIGS. 2A to 2H, waveforms a to j correspond to signals a to j shown in FIG. 1, respectively. Signals a, b, c, and d represent zero phase, $\pi/2$ phase, $\pi/4$ phase, and $-\pi/4$ phase output signals of the phase detector 2 shown in FIG. 1, respectively. Assuming that the frequency of the input modulation signal is $f_{in}$, its phase information $\phi$, and an oscillation frequency $f_0$ of the VCO, the following relation can be obtained:

$a = \cos \theta$
$b = \sin \theta$
$c = \sin (\theta + \pi/4)$
$d = \cos (\theta + \pi/4)$,
where
$\theta = 2\pi \Delta f t + \phi + \psi$
$\Delta f = f_{in} - f_0$
$\phi = 0, \pi/2, \pi, (3/2)\pi$
$\psi = \pi/4, (3/4)\pi, (5/4)\pi, (7/4)\pi$ Inputting the signals a and b in the exclusive OR circuit 101 for exclusive OR operation, signal e (FIG. 2C) is derived as its output signal. A signal f (FIG. 2D) is derived by applying the output of the exclusive OR circuit 101 to the delay circuit 104. If $\Delta f > 0$ where the delay time of the delay circuit 104 is T seconds, the signal f will have a waveform which is delayed by a phase difference $2\pi \Delta f T$ compared with the signal e as shown in FIG. 2D.

A signal g (FIG. 2E), i.e., the output of the exclusive OR circuit 102 is derived by the exclusive-OR-operation between signals c and d. The signals e and g are again subjected to an exclusive-OR operation to derive a signal h (FIG. 2F) in the exclusive OR circuit 103. The signal h is an output of the phase error detection circuit 4. The exclusive OR output i (FIG. 2G) of the circuit 105 between f and g and the phase error signal h are subtracted from each other at the circuit 106 to derive the signal j (FIG. 2H).

If $\Delta f$ is less than zero, signals a, b, c and d are given as follows:

$a' = \cos (-\theta) = \cos \theta$
$b' = \sin (-\theta) = -\sin \theta$
$c' = \sin (-\theta + \pi/4) = -\sin (\theta - \pi/4) = \cos (\theta + \pi/4)$
$d' = \cos (-\theta + \pi/4) = \cos (\theta - \pi/4) = \sin (\theta + \pi/4)$ It will be seen in FIGS. 2A and 2B that signal b is the inverse of b' and signals c and d coincide with signals d' and c', respectively. As a result, the frequency error signal j becomes a signal j' shown by a broken line in FIG. 2H.

When the phase locked loop circuit shown in FIG. 1 is in a correct synchronized state with $\Delta f = p$ and $\psi = \pi/4$, $\theta$ becomes either one of $\pi/4$, $(3/4)\pi$, $(5/4)\pi$, and $(7/4)\pi$, and the average voltage of the output signal h becomes the voltage of the broken line $k\Delta f=0$ in FIG. 2F. The signal i becomes the voltage of the broken line $i\Delta f=0$ in FIG. 2G. Similarly, the average voltage of the voltage-compared signal of signals h and i, that is, the average voltage of the output signal j will be as shown by $l\Delta f=0$ in broken line in FIG. 2H.

When the phase locked loop circuit is out of phase synchronism, or when the frequency of the input signal is frequency shifted by $f_c/n$ ($f_c$ is a clock frequency and n is an integer) from the oscillating frequency of the VCO 3 constituting the false locked state, $\theta$ is evenly distributed between 0 and $2\pi$ unlike in the correct synchronized state. For this reason, the DC component of the signal h is as shown by the broken line $k\Delta f=0$. The DC components of signals i and j become the same as the average voltages of the solid line waveforms shown in FIGS. 2G and 2H, thus differing from voltages of the broken lines $i\Delta f=0$ and $l\Delta f=0$.

Figure 3:
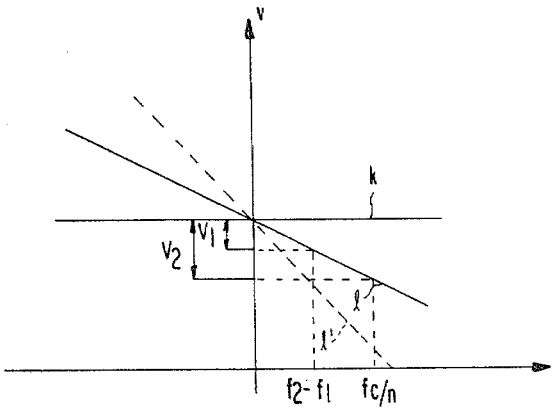
FIGS. 3 and 4 are diagrams showing voltage-frequency characteristic curves for describing the circuit operation of FIG. 1.

FIG. 3 shows, with the frequency taken along the abscissa, the voltages of signals k and l. In FIG. 3, the solid line l shows a characteristic for a delay time at the delay circuit 104, while the broken line l' shows a characteristic for a large delay time. In other words, the voltage of the signal l is proportional to the frequency error between the input signal and the output of VCO 3. The characteristic of the signal l, i.e., the slant of the line l or l' in FIG. 3 is determined by the delay time of the delay means 104 and the loop gain of the PLL. The loop gain is mainly decided by the gain of the voltage comparator 106.

Figure 4:
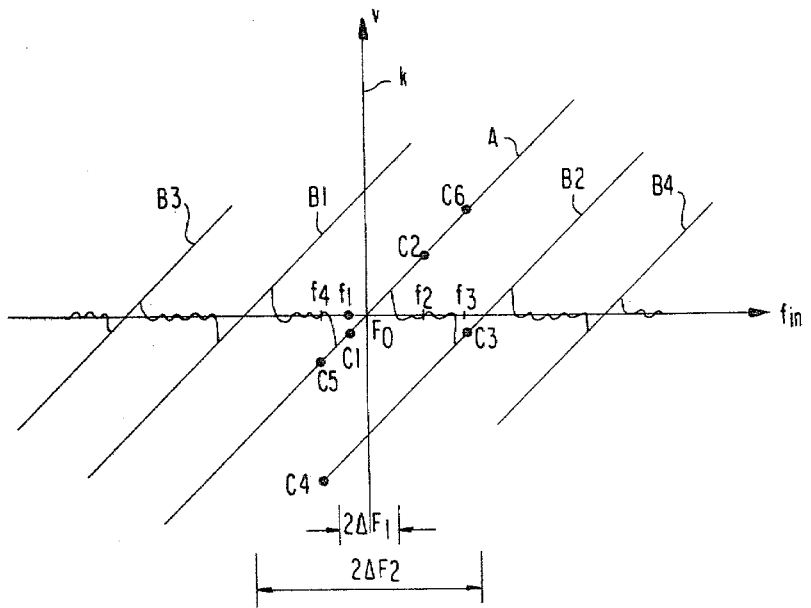

Referring to FIG. 4, slant line A shows a correct phase locked state, whereas the slant lines $B_1$, $B_2$, $B_3$, and $B_4$ show false locked states when the present invention is not applied. The unevenness along the abscissa shows unsynchronized states. The capturing operation of a phase locked loop circuit having input signals of frequencies $f_1$, $f_2$, and $f_3$ will now be described.

It is assumed here that the oscillation frequency of the VCO 3 if $F_0$ when voltages of broken lines $k\Delta f=0$ and $l\Delta f=0$ in FIGS. 2F and 2H are applied to its input terminals 9 and 10, that the capture range is $F_1 = (F_0 \pm F_1)$ when the present invention is not employed with voltages of the broken line for $l\Delta f=0$ (FIG. 2H) fixedly applied to the input terminal 10, and that the desired capture range is $\pm F_2$. Also it is further assumed that $F_1 = F_0 \pm \Delta F_1$, $F_2 = F_0 \pm \Delta F_2$, and $\Delta F_2 > \Delta F_1$, and that the modulation sensitivity to the frequency control input of the VCO 3 is $K_0$.

In the absence of the frequency control input, to the input terminals 9 and 10 of the VCO 3 are applied voltages of broken lines $k\Delta f=0$ and $l\Delta f=0$ (FIGS. 2F and 2H), respectively, with the oscillation frequency at $F_0$. When an input signal of frequency $f_1$ is applied, the phase locked loop circuit is quickly brought to a correct synchronized state since $f_1$ is within the range of $(F_0 \pm \Delta F_1)$, thus shifting to the state $C_1$ of the slant line A to maintain a synchronized state.

When an input signal of frequency $f_2$ is applied, the phase locked loop circuit is not initially in the synchronized state. However, a voltage $V_1$ of the frequency error signal $(f_2 - f_0)$ proportional to $\Delta f \cdot T$ (T is a delay time of the delay circuit) is applied to the input terminal 10 of the VCO 3, as shown in FIG. 3. The voltage $V_1$ raises the oscillating frequency with the result that $\Delta f$ is reduced. With $\Delta f$ reduced, $V_1$ is also lowered, moderating the upward change of the oscillation frequency of the VCO 3. With the gain of the voltage comparator 106 and the delay time of the delay circuit 104 set to make $V_1$ satisfy the relationship:

$$V_1 > \{f_2 - (F_0 + \Delta F_1)\}/K_0$$

(where $\Delta f = \Delta F_1$) a correct synchronized state can be achieved when the input frequency is $f_2$, and the phase locked loop circuit then maintains synchronization at point $C_2$ of the slant lines A.

As can be seen from the foregoing, to synchronize the phase locked loop at a desired capture range $F_0 \pm \Delta F_2$, the gain of the voltage comparator 106 and delay time of the delay circuit 7 may be set to satisfy the following formula:

$$V_1 > (\Delta F_2 - \Delta F_1)/K_0.$$

The delay time T may be set at from $0.2/f_c$ to $0.5/f_c$ second.

Next the capturing operation for the input frequency $f_3$ lying in the false locking range will be explained. The phase locked loop circuit initially assumes a synchronized state at a point $C_3$ on a slant line $B_2$, and is in a false locked state. However, a voltage $V_2$ proportional to $\Delta f (=f_c/n)$ is soon applied at the second input terminal 10 of the VCO 3 (see FIG. 3). The voltage $V_2$ tends to raise the oscillating frequency of the VCO 3. To cancel the adverse effect of the voltage $V_2$, the phase locked loop circuit provides an equal voltage of an opposite polarity at input terminal 9. However, the desired cancellation can not be achieved if the voltage $V_2$ is high, allowing momentarily an unsynchronized state. The false locked state $B_2$ is therefore eventually avoided, with the compensatory voltage diminishing to quickly lower the control voltage at the first input terminal 9 of the VCO 3. With the voltage proportional to $\Delta f = f_3 - f_0$ applied to the second input terminal 10, the oscillating frequency of the VCO 3 is raised to be eventually synchronized with the frequency of the correct synchronized state A. Then, the voltage at the second input terminal 10 of the VCO 3, that is, the frequency error signal, extinguishes, to finally maintain a synchronized state at a point $C_6$ on the slant line A.

This capturing operation is equivalent to the following operation shown in FIG. 4. The phase locked loop circuit initially attains synchronization at a point $C_3$ on the slant line $B_2$, which is in a false locked state for input signal frequency $f_3$; thereafter lowering the frequency of the input modulation signal to frequency $f_4$, i.e., attaining the correct synchronous state $C_5$ from the lower edge $C_4$ on the slant line $B_2$; finally raising the input frequency to shift to the synchronized state $C_6$ corresponding to the initial frequency $f_3$. The following formula is required to permit the phase locked loop circuit to operate in the range of $F_0 \pm F_2$;

$$V_2 > (F_0 + F_2 - f_4)/K_0$$

Accordingly, to permit the phase locked loop circuit to capture the correct synchronized locking, the gain of the voltage comparator 106 and delay time of the delay circuit 104 have to be set to satisfy a relationship as follows:

$$V_1 > (\Delta F_2 - \Delta F_1)/K_0 \text{ and } V_2 > (F_0 + \Delta F_2 - f_4)/K_0$$

Even if a false locked state exists within a desired capture range, the phase locked loop circuit itself operates to get out of the false locked state as described above. Consequently, in accordance with the present invention, a noise level sensing circuit, synchronization decision circuit, etc. are not needed for the phase locked loop, while stable operation is assured even when the input signal is subjected to severe band restriction, or even when the input signal is affected by thermal noise.

In FIG. 1, the voltage comparator 106 can be constituted by a differential DC amplifier because both the circuits 103 and 105 have the same characteristic. When the delay circuit 104 is inserted on the side of the signal g in reversal of FIG. 1, connections on the input side of the differential DC amplifier can also be reversed from that shown in FIG. 1. Incidentally, if one of the signals h and i is inverted, the comparator 106 may be constituted by a resistor hybrid.

Figure 5A:
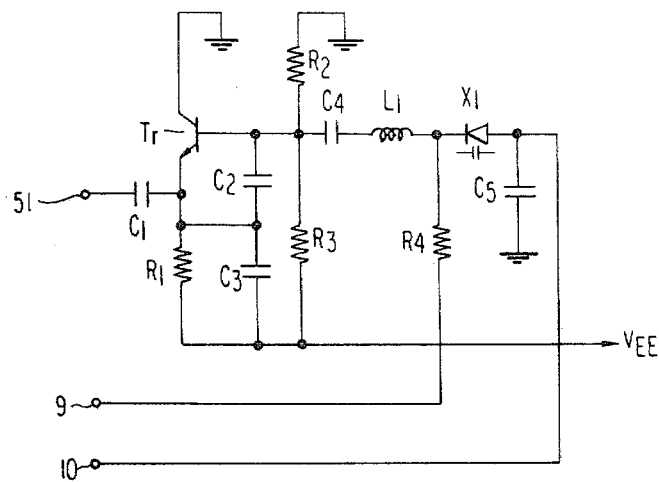
FIGS. 5A and 5B are schematic diagrams of the voltage-controlled oscillator shown in FIG. 1.

FIG. 5A is a schematic diagram of the voltage-controlled oscillator 3. In response to the change in the capacitance of variable capacitance diode $X_1$ caused by a control voltage applied to control terminals 9 and 10, the oscillation frequency of a Colpitts oscillation circuit changes. The oscillation circuit consists of a transistor Tr, resistor $R_1$, capacitors $C_2$ and $C_3$, coil $L_1$, and diode $X_1$. The oscillation output is derived from an output terminal 51.

Figure 5B:
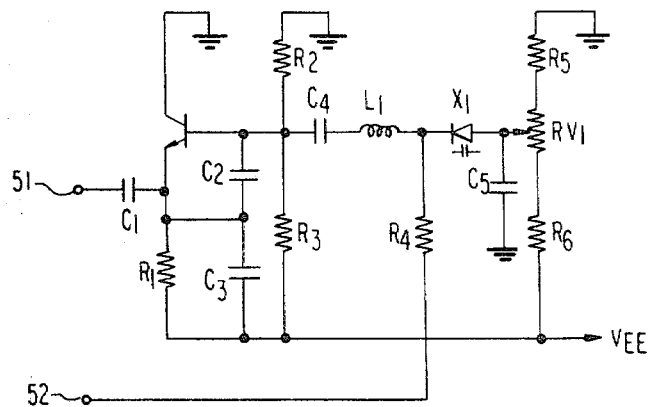

When the VCO has only one control-voltage input terminal as shown in FIG. 5B, instead of separate terminals 9 and 10 the outputs of LPSs 7 and 8 may be combined by a resistor circuit for application to the terminal 52.

Reference characters $C_1$ and $C_4$ denote DC blocking capacitors; $C_5$, a high frequency bypass capacitor; $R_2$ and $R_3$, bias resistors for the transistor Tr; and $R_5$, $R_6$, and $RV_1$, potential dividing resistors to give a semi-fixed voltage at one end of the diode $X_1$.

Figure 6:
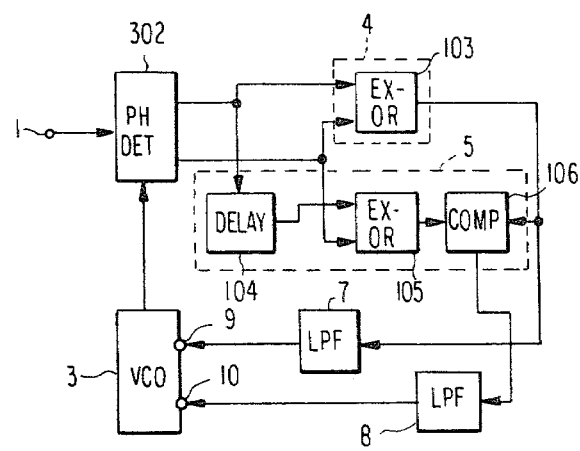
FIGS. 6 and 7 are block diagrams of modifications of the circuit shown in FIG. 1.
Figure 7:
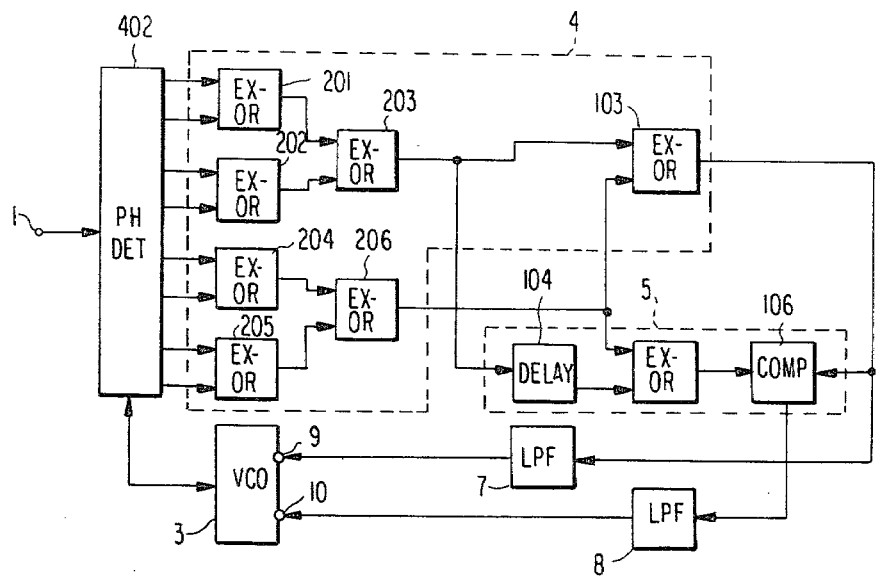

FIGS. 6 and 7 are modifications of the circuit shown in FIG. 1. FIGS. 6 and 7 show examples for a 2-phase phase-modulated input carrier and an 8-phase phase-modulated carrier wave signal, respectively. The reference numeral 302 of FIG. 6 denotes a 4-phase phase detector; 402 of FIG. 7, a 16-phase phase detector; and 201 through 206, exclusive OR circuits. The operation of the phase locked loop circuits shown in FIGS. 6 and 7 are substantially the same as that of FIG. 1. As can be seen from FIGS. 1, 6 and 7, the phase locked loop circuit of the present invention is applicable to $2^n$-phase (n is a positive integer) phase-modulated carrier waves.

FIG. 8 is a block diagram of another preferred embodiment of the present invention based on the inverse modulation technique. The like reference numerals 1, 4, 5, and 7 to 10 denote like structural elements shown in FIG. 1. The numeral 11 denotes an N-phase phase detector; 12, an N-phase phase modulator; 108, a delay means; 107, a phase comparator; and 109, a phase comparator having the same characteristics as those of the phase comparator 107. The N-phase phase modulated carrier wave supplied to the input terminal 1 is applied to the N-phase phase detector 11 where it is phase-detected with the oscillation output from VCO 3 as a reference. The output of the N-phase detector 11 is inputted to the N-phase phase modulator 12 to which the modulated carrier wave is also applied. The modulated carrier wave is inversed modulated at the modulator 12 by the demodulated signal from the N-phase phase detector 11 to remove the phase modulation component therefrom. Thus, the unmodulated carrier component is provided for the phase comparators 107 and 109. The output signal of the VCO 3 is supplied to the phase detector 11, the phase comparator 107 and delay circuit 108. The output of the phase comparator 107 constituting the phase error signal is supplied to the first input terminal 9 of the VCO 3 through the low pass filter 7.

With the delay time of the delay circuit 108 set at $m/F_0$ second (m is an integer) and at $0.2/f_c$ through $0.5/f_c$ second, the output signal of the phase comparator 109 has a voltage corresponding to the phase error and the frequency difference between the input phase modulated carrier wave and the oscillation frequency of the VCO 3. The outputs of the phase error detection circuit 4 and comparator 109 are supplied to the voltage comparator 106 where the phase error components are removed to obtain only frequency error components. The output signal of the frequency error detection circuit 5 is applied to the second input terminal 10 of the VCO 3 through the low-pass filter 8. As in the embodiment of FIG. 1, the second input terminal 10 of the VCO 3 has a voltage which changes to cause a shift to the correct synchronized state when the phase locked loop circuit is in false locked state, thereby broadening the capture range.

As above explained, the present invention provides a phase locked loop circuit capable of restoring the phase locked state over a broad capture range without causing the false locked state.

What is claimed is:

1. A phase locked loop circuit comprising:
a voltage-controlled oscillator for generating a reference phase signal in response to a control signal;
phase detecting means for receiving an N-phase ($N=2^n$, n is a positive integer) phase-modulated carrier wave and said reference phase signal and for detecting said carrier wave on the basis of said reference phase signal, said phase detecting means providing mutually orthogonal outputs;
means connected to the output of said phase detecting means for detecting phase and frequency errors between said modulated carrier wave and said reference phase signal, said phase and frequency error detecting means comprising n-stage multiplication means for multiplying said mutually orthogonal outputs of said phase detecting means, the nth stage of said n-stage multiplication means having first and second inputs, delay means having an input coupled to the first input of said nth stage for delaying said first input of said nth stage of said n-stage multiplication means by a predetermined time, one-stage multiplication means for multiplying the second input of said nth stage by the output of said delay means, and means for voltage-comparing the output of said n-stage multiplication means with that of said one-stage multiplication means to cancel said phase error contained in the outputs of said n-stage multiplication means and one-stage multiplication means; and
means for supplying the outputs of said phase and frequency error detecting means to said voltage-controlled oscillator as said control signal.

2. A phase locked loop circuit comprising: a voltage-controlled oscillator for generating reference phase signal in response to a control signal, phase detecting means for receiving an N-phase ($N=2^n$, n is a positive integer) phase-modulated carrier wave and said reference phase signal and for phase-detecting said carrier on the basis of said reference phase signal, first detecting means connected to the output of said phase detecting means and that of said voltage-controlled oscillator for detecting a phase error between said modulated carrier signal and said reference phase signal, second detecting means connected to the output of said phase detecting means and that of the said voltage-controlled oscillator for detecting a frequency error and said phase error between said modulated carrier signal and said reference phase signal, means for voltage-comparing the output of said first detecting means with that of second detecting means to cancel said phase errors contained in the outputs of said first and second detecting means, and means for supplying the outputs of said first detecting means and that of the said voltage-comparing means to said voltage-controlled oscillator as said control signal.

3. A phase locked loop circuit as claimed in claim 2, in which said first detecting means comprises a first phase comparison means for phase-comparing the output of said phase detecting means with that of said voltage-controlled oscillator; and said second detecting means comprises means for delaying the output of said voltage-controlled oscillator by a predetermined time, and second phase comparison means for phase-comparing the output of said phase detecting means with that of said delay means.

4. A phase locked loop circuit as claimed in claim 1 or 2, in which said voltage-comparing means comprises a differential amplifier.

* * * * *

UNITED STATES PATENT AND TRADEMARK OFFICE
CERTIFICATE OF CORRECTION

PATENT NO. : 4,338,574

DATED : July 6, 1982

INVENTOR(S) : Toshio FUJITA et al.

It is certified that error appears in the above—identified patent and that said Letters Patent is hereby corrected as shown below:

Column 1, lines 62-63, delete "multi-phase modulated" insert

--multi-phase phase modulated--

Column 2, line 2, delete "n" insert --$\underline{n}$-- line 12, delete "DESCRIPTION OF THE DRAWINGS" insert

--BRIEF DESCRIPTION OF THE DRAWINGS-- lines 31-32, delete "DESCRIPTION OF THE PREFERRED

EMBODIMENT" insert --DETAILED DESCRIPTION OF THE

PREFERRED EMBODIMENT-- line 42, delete "signal a." insert --signal $\underline{a}$.-- line 45, delete "signal b." insert --signal $\underline{b}$.-- line 45, delete "a and b" insert --$\underline{a}$ and $\underline{b}$-- line 47, delete "c and d" insert --$\underline{c}$ and $\underline{d}$-- line 48, delete "c" insert --$\underline{c}$-- line 49, delete "d" insert --$\underline{d}$-- line 54, delete "e and g" insert --$\underline{e}$ and $\underline{g}$-- line 56, delete "h." insert --$\underline{h}$.--

UNITED STATES PATENT AND TRADEMARK OFFICE
CERTIFICATE OF CORRECTION

PATENT NO. : 4,338,574
DATED : July 6, 1982
INVENTOR(S) : Toshio FUJITA et al.

It is certified that error appears in the above—identified patent and that said Letters Patent is hereby corrected as shown below:

line 58, delete "e" insert --$\underline{e}$-- line 60, delete "g" insert --$\underline{g}$-- line 61, delete "i" insert --$\underline{i}$-- line 63, delete "h" insert --$\underline{h}$-- line 67, delete "h" insert --$\underline{h}$--

Column 3, line 1, delete "k" insert --$\underline{k}$-- line 2, delete "j" insert --$\underline{j}$-- line 4, delete "h" insert --$\underline{h}$-- line 4, delete "i" insert --$\underline{i}$-- line 5, delete "j" insert --$\underline{j}$-- line 7, delete "l" insert --$\underline{l}$-- line 8, delete "a to j" insert --$\underline{a}$ to $\underline{j}$-- line 9, delete "a to j" insert --$\underline{a}$ to $\underline{j}$-- line 10, delete "a, b, c, and d" insert --$\underline{a}$, $\underline{b}$, $\underline{c}$, and $\underline{d}$-- line 25, delete "a and b" insert --$\underline{a}$ and $\underline{b}$-- line 26, delete "e" insert --$\underline{e}$--

UNITED STATES PATENT AND TRADEMARK OFFICE
CERTIFICATE OF CORRECTION

PATENT NO. : 4,338,574

DATED : July 6, 1982

INVENTOR(S) : Toshio FUJITA et al.

It is certified that error appears in the above—identified patent and that said Letters Patent is hereby corrected as shown below:

line 27, delete "f" insert --$\underline{f}$-- line 31, delete "f" insert --$\underline{f}$-- line 32, delete "e" insert --$\underline{e}$-- line 34, delete "g" insert --$\underline{g}$-- line 36, delete "c and d" insert --$\underline{c}$ and $\underline{d}$-- line 36, delete "e and g" insert --$\underline{e}$ and $\underline{g}$-- line 38, delete "h" insert --$\underline{h}$-- line 39, delete "h" insert --$\underline{h}$-- line 40, delete "i" insert --$\underline{i}$-- line 41, delete "f and g" insert --$\underline{f}$ and $\underline{g}$-- line 41, delete "h" insert --$\underline{h}$-- line 43, delete "j" insert --$\underline{j}$-- line 44, delete "a, b, c and d" insert --$\underline{a}$, $\underline{b}$, $\underline{c}$ and $\underline{d}$- line 50, delete "b" insert --$\underline{b}$-- line 51, delete "b'" insert --$\underline{b}$'-- line 51, delete "c and d" insert --$\underline{c}$ and $\underline{d}$-- line 51, delete "d'" insert --$\underline{d}$'--

UNITED STATES PATENT AND TRADEMARK OFFICE
CERTIFICATE OF CORRECTION

PATENT NO. : 4,338,574
DATED : July 6, 1982
INVENTOR(S) : Toshio FUJITA et al.

It is certified that error appears in the above—identified patent and that said Letters Patent is hereby corrected as shown below:

line 52, delete "c'" insert --$\underline{c}$'-- line 53, delete "j" insert --$\underline{j}$-- line 53, delete "j'" insert --$\underline{j}$'-- line 56, delete "Δf=p" insert --Δf=0-- line 58, delete "h" insert --$\underline{h}$-- line 60, delete "i" insert --$\underline{i}$-- line 62, delete "h and i" insert --$\underline{h}$ and $\underline{i}$-- line 63, delete "j" insert --$\underline{j}$-- line 68, delete "n" insert --$\underline{n}$--

Column 4, line 4, delete "h" insert --$\underline{h}$-- line 5, delete "i and j" insert --$\underline{i}$ and $\underline{j}$-- line 10, delete "k and l" insert --$\underline{k}$ and $\underline{l}$-- line 11, delete "l" insert --$\underline{l}$-- line 12, delete "l'" insert --$\underline{l}$'-- line 14, delete "l" insert --$\underline{l}$-- line 16, delete "l," insert --$\underline{l}$,-- line 17, delete "l or l'" insert --$\underline{l}$ or $\underline{l}$'--

UNITED STATES PATENT AND TRADEMARK OFFICE
CERTIFICATE OF CORRECTION

PATENT NO. : 4,338,574

DATED : July 6, 1982

INVENTOR(S) : Toshio FUJITA et al.

It is certified that error appears in the above—identified patent and that said Letters Patent is hereby corrected as shown below:

line 30, delete "if" insert --is-- line 33, delete "$(F_0 \pm F_1)$" insert --$(F_0 \pm \Delta F_1)$-- line 65, delete "(where $\Delta f = \Delta F_1$)" insert

--(where $\Delta f = \Delta F_1$),--

Column 5, line 45, delete "$F_0 \pm F_2$;" insert --$F_0 \pm \Delta F_2$:-- line 47, delete "$V_2 > (F_0 + F_2 - f_4)/K_0$" insert

--$V_2 > (F_0 + \Delta F_2 - f_4)/K_0$--

Column 6, line 2, delete "g" insert --$\underline{g}$-- line 5, delete "h and i" insert --$\underline{h}$ and $\underline{i}$-- line 16, delete "VCO" insert --$VCO_3$-- line 36, delete "(n" insert --($\underline{n}$-- line 66, delete "(m is" insert --($\underline{m}$ is--

Signed and Sealed this

Fifth Day of October 1982

[SEAL]

Attest:

GERALD J. MOSSINGHOFF

Attesting Officer      Commissioner of Patents and Trademarks